United States Patent
Niggl et al.

[19]

[11] Patent Number: 6,100,468
[45] Date of Patent: Aug. 8, 2000

[54] HOUSING FOR ELECTRICAL ASSEMBLIES

[75] Inventors: Heinz-Juergen Niggl, Poecking; Georg Buchberger, Munich; Stefan Schwind, Olching, all of Germany; Matthew-T Hannigan, San Jose, Calif.

[73] Assignee: Siemens Aktiengesellschaft, Munich, Germany

[21] Appl. No.: 09/136,119

[22] Filed: Aug. 18, 1998

[30] Foreign Application Priority Data

Aug. 18, 1997 [DE] Germany ............... 297 14 762 U

[51] Int. Cl.⁷ ..................................................... H05K 5/00
[52] U.S. Cl. ..................... 174/52.1; 361/690; 361/735; 361/825
[58] Field of Search .................. 74/52.1, 35 R, 74/35 MS, 37, 38, 50; 361/690, 735, 825

[56] References Cited

U.S. PATENT DOCUMENTS

| | | | |
|---|---|---|---|
| 5,398,159 | 3/1995 | Anderson et al. | 361/695 |
| 5,583,750 | 12/1996 | Nakata et al. | 361/816 |
| 5,901,033 | 5/1999 | Crawford et al. | 361/600 |

*Primary Examiner*—Tan Nguyen
*Assistant Examiner*—Ronnie Mancho
*Attorney, Agent, or Firm*—Hill & Simpson

[57] ABSTRACT

A housing for electrical assemblies is composed of at least one chassis, whereby u-shaped connecting clips open toward the back are arranged between the individual chassis, the u-shaped clips being composed of vertically proceeding, perforated plates that terminate flush with the chassis. A floor part composed of a fire protection floor and a floor clip that is fashioned similar to the connecting clip and a cover part composed of an upper covering and a cover clip that is fashioned similar to the connecting clip are also provided.

21 Claims, 6 Drawing Sheets

HOUSING FOR ELECTRICAL ASSEMBLIES

FIELD OF THE INVENTION

The present invention relates to housings for electrical assemblies and, more specifically, to housing for accepting or receiving electrical assemblies.

BACKGROUND OF THE INVENTION

It is known to accommodate assemblies in individual chassis, which are then installed in a cabinet. The heat dissipation ensues by free or, respectively, forced convection of the entire cabinet. What is thereby disadvantageous is that the cabinet must be completely pre-formed even for small systems that might need to be expanded in the future. High fabrication and acquisition costs arise as a result thereof, particularly for small systems that might need to be expanded in the future. In this case, too, the system has a very large, unnecessary volume.

Another possibility of accommodating or housing electrical assemblies is comprised therein that the individual assemblies are accommodated in systems and the complete systems are stacked directly on top of one another. Each system thereby has its own heat elimination. A very high structural height is reached due to the stacking of the complete systems. Added thereto as a further disadvantage is that parts required only once (for example fire protection floors, coverings, etc.) are employed multiply, which results in unnecessary costs. Further, the heat dissipation is unfavorable since it is not directly optimized for the stacking.

A further possibility for accommodating assemblies lies in the use of multiple chassis that are stacked directly on one another and are supplemented by a floor and cover part. The cooling air thereby enters at the floor part and re-emerges at the cover. What is disadvantageous in this case is that the assemblies lying higher or on top of other assemblies are heated by the heated exhaust air from the assemblies disposed therebelow.

SUMMARY OF THE INVENTION

An object of the invention is to provide a housing for the acceptance of electrical assemblies with a flexible mechanical connection of stacked chassis, particularly taking an optimum heat dissipation of every chassis into consideration.

For achieving this object, a housing for the acceptance of electrical assemblies is provided which comprises at least one chassis that is essentially composed of two side parts that are connected to one another via upper and lower guide grates, u-shaped connecting clips that are open toward the back and arranged between the individual chassis, said connecting clips being composed of perpendicularly arranged perforated plates that terminate flush with the chassis, a floor part composed of a fire protection floor and a floor clip that is fashioned similar to the connecting clip, and a cover part composed of an upper covering and a cover clip that is fashioned similar to the connecting clip, whereby the clips are respectively firmly connected to the fire protection floor and the upper covering as well as to the individual chassis.

The advantages of the inventive housing are comprised therein that the entire system is flexibly adaptable to the requirements of the individual chassis. No pre-performances for a complete cabinet need ensue, and the inventive housing has no unnecessary additional parts as in the case of stacked complete systems. An optimum adaptation of the housing to the specific requirements of the heat dissipation is also provided.

In an embodiment, the present invention provides a housing for accommodating electrical assemblies which comprises at least two chassis including a top chassis and a bottom chassis. Each of the chassis comprise two spaced apart side parts connected to one another by an upper guide grate and a lower guide grate. The top chassis is connected to the bottom chassis by a u-shaped connecting clip. The u-shaped connecting clip has an open backside with a perforated front wall disposed between two perforated sidewalls. The front and sidewalls being disposed flush with the top and bottom chassis. The open backside of the connecting clip providing a space for cabling to pass into the housing. The bottom chassis being connected to a floor part comprising a fire protection floor and a u-shaped floor clip disposed between and connected to the bottom chassis and the fire protection floor. The floor clip comprising an open backside with a perforated front wall disposed between two perforated sidewalls. The front and sidewalls being disposed flush with the bottom chassis. The open backside of the floor clip providing a space for cabling to pass into the housing. The top chassis is connected to a cover part comprising an upper covering and a u-shaped cover clip disposed between and connected to the upper covering and the top chassis. The cover clip comprises a perforated front wall disposed between two perforated sidewalls. The front and sidewalls being disposed flush with the top chassis.

In an embodiment, the top and bottom chassis further comprise a u-shaped rear panel that substantially surrounds the cabling passing through the backside of the connecting clip.

In an embodiment, the bottom chassis further comprises a u-shaped rear panel having an upper end that substantially surrounds the cabling passing through the backside of the connecting clip and a lower end that substantially surrounds the cabling passing through the backside of the floor clip.

In an embodiment, the connecting clip further comprises an exhaust air plate for directing air out through the perforated front and sidewalls of the connecting clip.

In an embodiment, the connecting clip further comprises an intake air plate for directing air inward through the perforated front and sidewalls of the connecting clip.

In an embodiment, the floor clip further comprises at least one aeration ventilator.

In an embodiment, the cover clip further comprises at least one aeration ventilator.

In an embodiment, the housing of the present invention comprises a single chassis disposed between a floor part and a cover part.

In an embodiment, the housing of the present invention comprises a top chassis, a bottom chassis and at least one middle chassis disposed therebetween. The top chassis being connected to a middle chassis by a u-shaped connecting clip; the bottom chassis being connected to a middle chassis by a u-shaped connecting clip.

Other objects and advantages of the invention will become apparent upon reading the following detailed description and appended claims, and upon reference to the accompanying drawings.

BRIEF DESCRIPTION OF THE DRAWING

Expedient developments of the inventive housing derive from the subclaims as well as from the following description of an exemplary embodiment with reference to the attached drawing, wherein:

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 1:
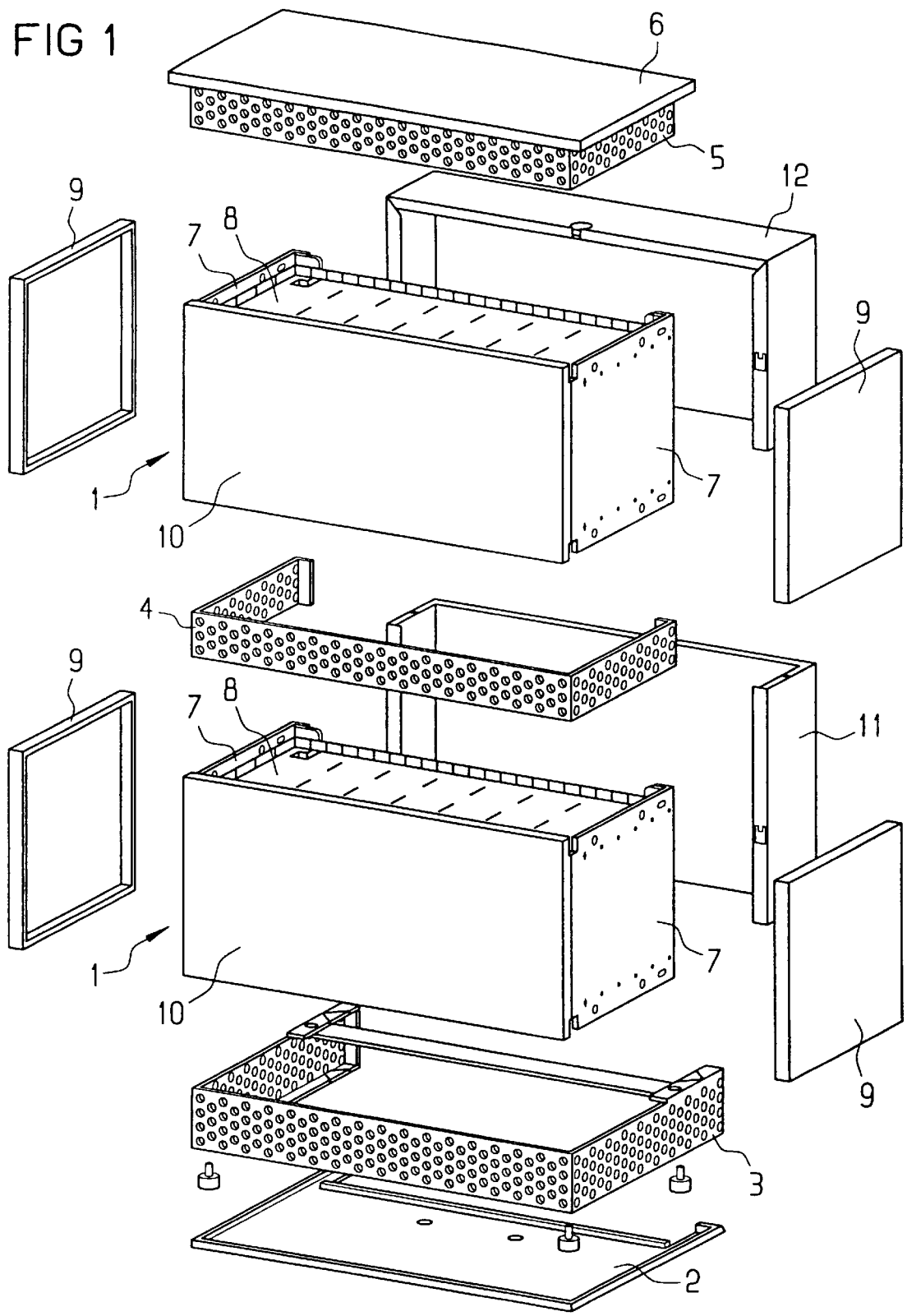
FIG. 1 is an exploded view of a housing for the acceptance of electrical assemblies made in accordance with the present invention.

The housing illustrated in FIG. 1 and constructed according to the present invention is essentially composed of two chassis 1. These chassis are essentially composed of two side parts 7 with an upper guide grate 8 and a lower guide grate (not shown in FIG. 1). Electrical assemblies (also not shown) can be inserted into these chassis 1.

The inventive housing is composed of a fire protection floor 2 and of a floor clip 3 onto which the lowest chassis 1 is placed.

The floor clip 3 is composed of a perforated plate, so that air circulation is possible. The outside dimensions of the floor clip 3 are selected such that it terminates flush with the chassis 1.

Given the housing illustrated here, a connecting clip 4 is provided on the lower chassis 1. This connecting clip 4, just like the floor clip 3, is composed of a perforated plate in order to enable an air circulation and therefore, heat dissipation. A further chassis 1 is provided over the connecting clip 4. A cover clip 5, likewise composed of a perforated plate, and an upper covering 6 are provided on this upper chassis 1.

Further, side panellings 9, panellings 10 of the front side as well as panellings 11 and 12 of the back side are provided. The panellings 11 and 12 of the back side are designed such that they surround the entire terminal cabling and connecting cabling between the individual assemblies and chassis.

The housing according to the present invention illustrated here is composed of two chassis 1. According to the present invention, however, a housing can also be composed of only one chassis or, respectively, of three or more chassis 1. It is clear that the modular housing of the present invention can be expanded. In that the connecting clips are composed of a perforated plate, an optimum matching of the system to the specific requirements of heat elimination is established.

Figure 2:
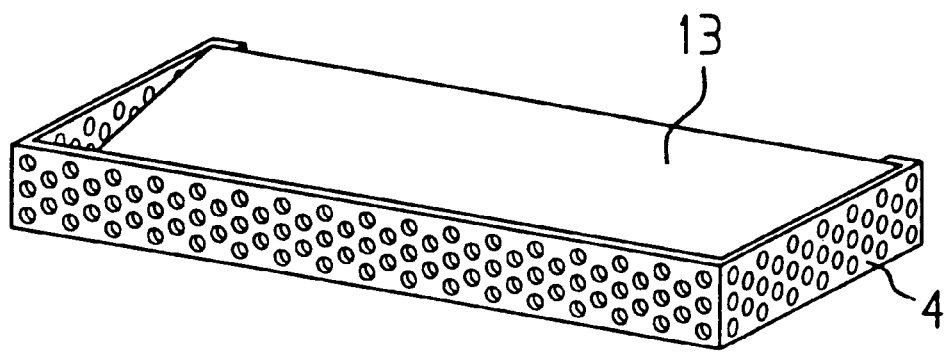
FIG. 2 is a perspective view of a connecting clip of the housing shown in FIG. 1 with a waste air plate.
Figure 3:
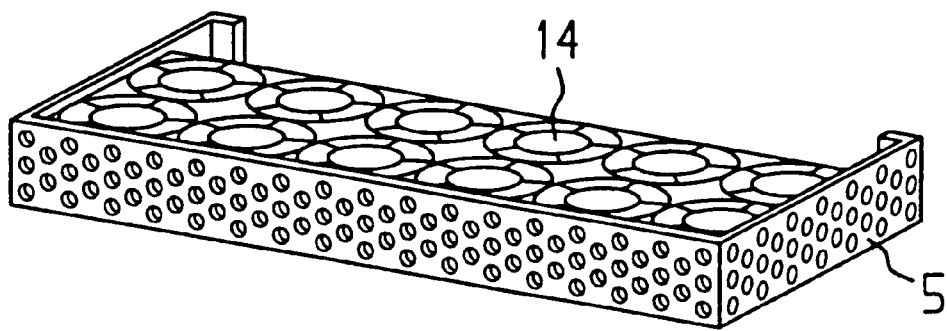
FIG. 3 is a perspective view of a connecting clip of the housing shown in FIG. 1 with a plurality of ventilators.

For example, it is thus possible to provide a waste air plate 13 in a connecting clip for designational air guidance as shown in FIG. 2. Further, ventilators 14 can be provided in the floor clip 3 or in the cover clip 5 for a designational heat elimination as shown in FIG. 3.

Figure 4:
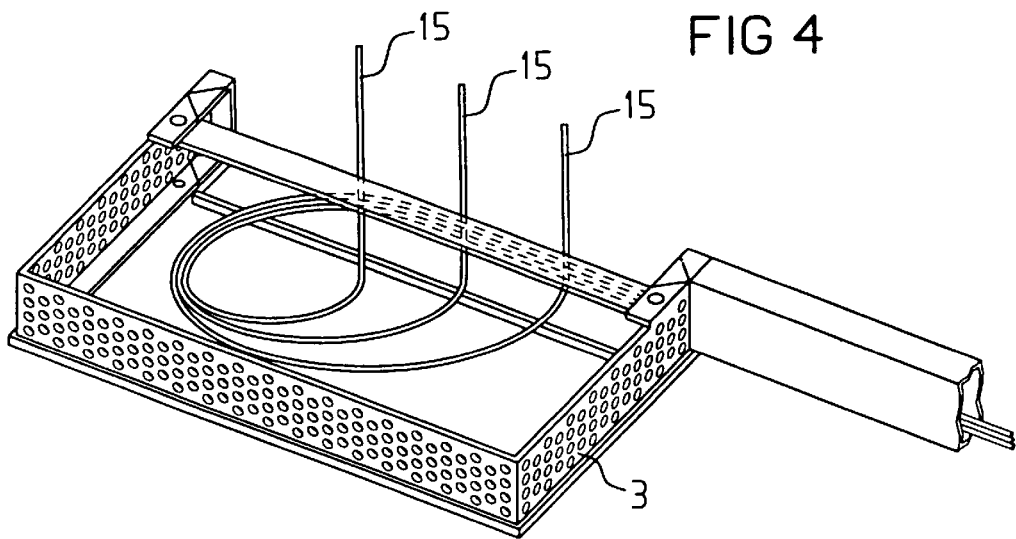
FIG. 4 is a perspective view of a floor clip of the housing shown in FIG. 1 in the operating condition.
Figure 5:
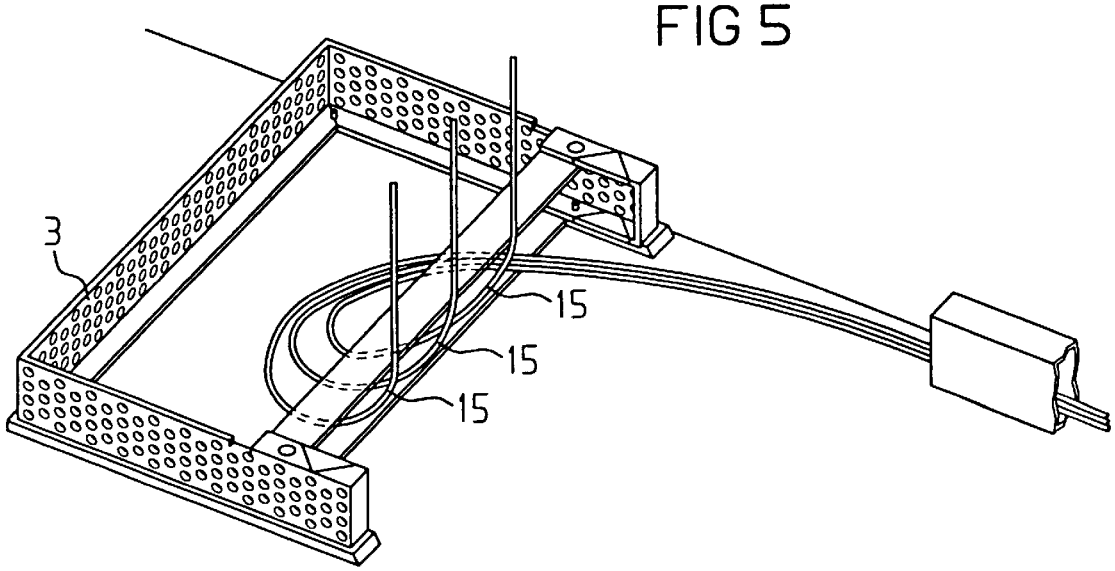
FIG. 5 is a perspective view of a floor clip of the housing shown in FIG. 1 during the equipping condition.
Figure 6:
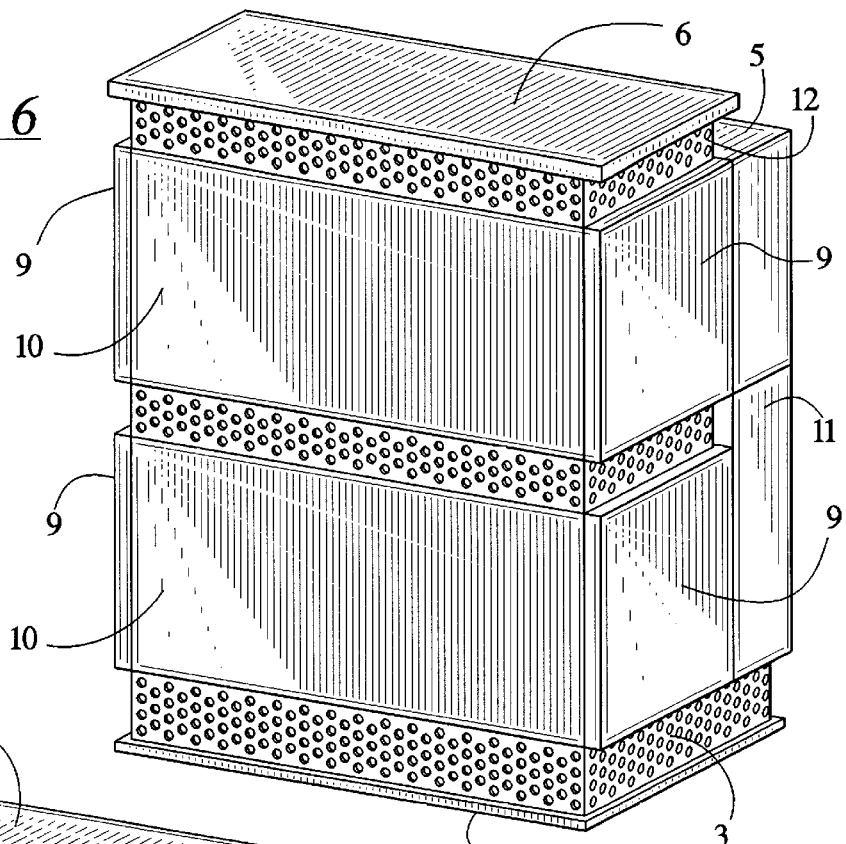
FIG. 6 is a perspective view of the housing of FIG. 1 in an assembled condition.
Figure 7:
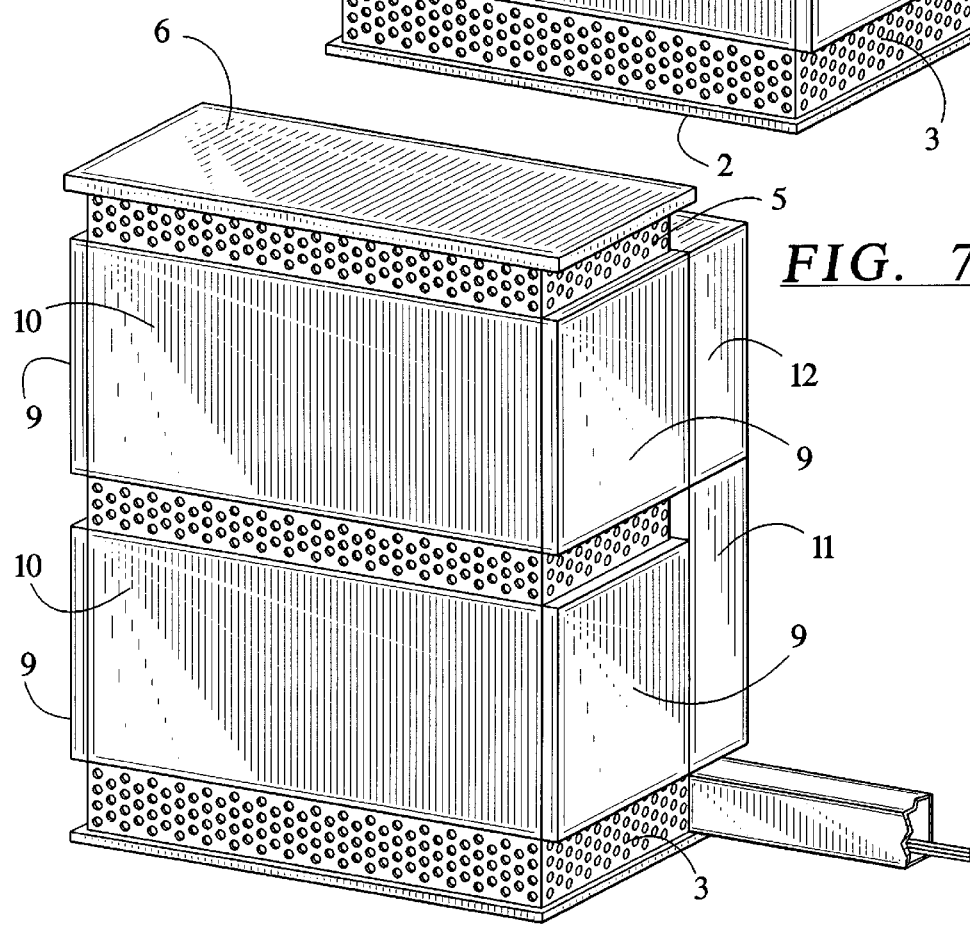
FIG. 7 is a perspective view of the housing shown in FIG. 6 equipped with the floor clip illustrated in FIG. 4.
Figure 8:
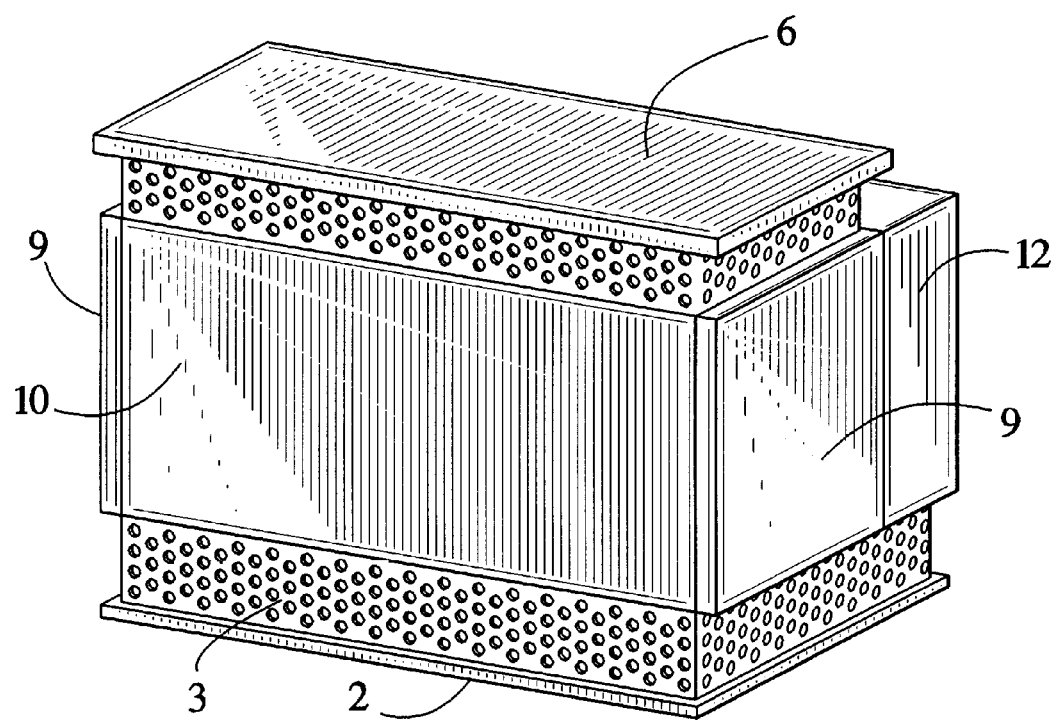
FIG. 8 is a perspective view of an assembled housing with a single chassis, cover clip and floor clip.
Figure 9:
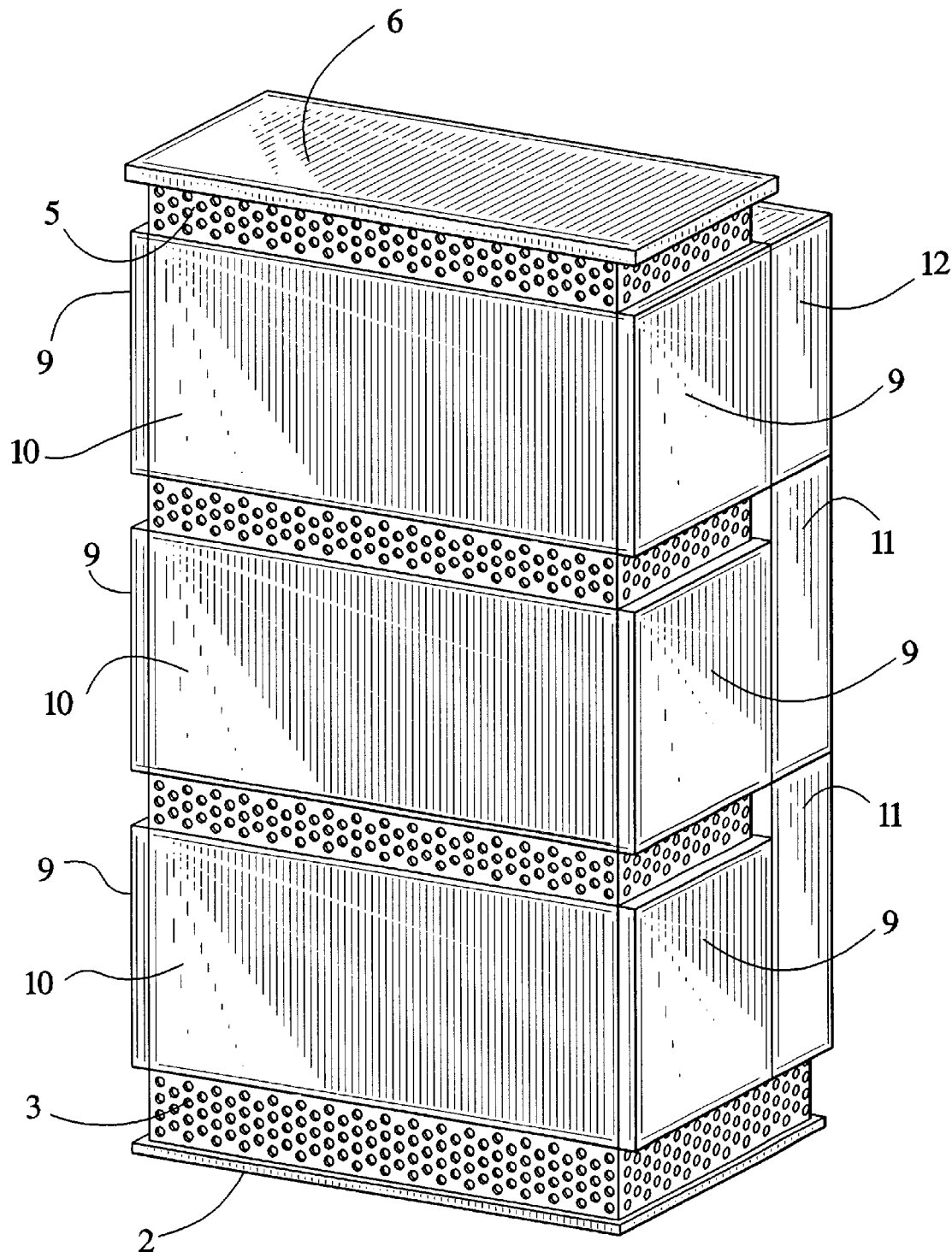
FIG. 9 is a perspective view of an assembled housing with three chassis.

As shown in FIGS. 4 and 5, the floor clip can be employed for the acceptance of cable reserves 15, so that the housing can easily be moved away from its location at a wall during cabling jobs without having to disconnect connecting cables 15.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. A housing for accommodating electrical assemblies, the housing comprising;
   at least two chassis including a top chassis and a bottom chassis, each of said chassis comprising two spaced apart side parts connected to one another by an upper grade grate, a lower guide grate and a front wall,
   the top chassis being connected to the bottom chassis by a u-shaped connecting clip, the u-shaped connecting clip having an open back side with a perforated front wall disposed between two perforated side walls, the front and side walls being disposed flush with the top and bottom chassis, the open back side of the connecting clip providing a space for cabling to pass into the housing,
   the bottom chassis being connected to a floor part comprising a fire protection floor and a u-shaped floor clip disposed between and connected to the bottom chassis and the fire protection floor, the floor clip comprising an open back side with a perforated front wall disposed between two perforated side walls, the front and side walls being disposed flush with the bottom chassis, the open back side of the floor clip providing a space for cabling to pass into the housing, and
   the top chassis being connected to a cover part comprising an upper covering and a u-shaped cover clip disposed between and connected to the upper covering and the top chassis, the cover clip comprising a perforated front wall disposed between two perforated side walls, the front and side walls being disposed flush with the top chassis.

2. The housing of claim 1 wherein the top and bottom chassis each further comprise two side panels that overlay the side parts and a front panel that overlays the front wall.

3. The housing of claim 2 wherein the top and bottom chassis further comprise a u-shaped rear panel that substantially surrounds the cabling passing through the back side of the connecting clip.

4. The housing of claim 2 wherein the bottom chassis further comprises a u-shaped rear panel having an upper end that substantially surrounds the cabling passing through the back side of the connecting clip and a lower end that substantially surrounds the cabling passing through the back side of the floor clip.

5. The housing of claim 1 wherein the connecting clip further comprises an exhaust air plate for directing air out through the perforated front and side walls of the connecting clip.

6. The housing of claim 1 wherein the connecting clip further comprises an intake air plate for directing air inward through the perforated front and side walls of the connecting clip.

7. The housing of claim 1 wherein the floor clip further comprises at least one aeration ventilator.

8. The housing of claim 1 wherein the cover clip further comprises at least one aeration ventilator.

9. A housing for accommodating electrical assemblies, the housing comprising:

a chassis comprising two spaced apart side parts connected to one another by an upper guide grate, a lower guide grate and a front wall, the chassis further comprising a top end and a bottom end, the bottom end of the chassis being connected to a floor part comprising a fire protection floor and a u-shaped floor clip disposed between and connected to the bottom end of the chassis and the fire protection floor, the floor clip comprising an open back side with a perforated front wall disposed between two perforated side walls, the front and side walls being disposed flush with the bottom end of the chassis, the open back side of the floor clip providing a space for cabling to pass into the chassis, and the top end of the chassis being connected to a cover part comprising an upper covering and a u-shaped cover clip disposed between and connected to the upper covering and the top end of the chassis, the cover clip comprising a perforated front wall disposed between two perforated side walls, the front and side walls being disposed flush with the top end of the chassis.

10. The housing of claim 9 wherein the chassis further comprises two side panels that overlay the side parts and a front panel that overlays the front wall.

11. The housing of claim 10 wherein the chassis further comprises a u-shaped rear panel that substantially surrounds the cabling passing through the back side of the floor clip.

12. The housing of claim 9 wherein the floor clip further comprises at least one aeration ventilator.

13. The housing of claim 9 wherein the cover clip further comprises at least one aeration ventilator.

14. A housing for accommodating electrical assemblies, the housing comprising:

at least three chassis including a top chassis, a bottom chassis and at least one middle chassis disposed therebetween, each of said chassis comprising two spaced apart side parts connected to one another by an upper guide grate, a lower guide grate and a front wall, the top chassis being disposed between a cover part and the at least one middle chassis, the bottom chassis being disposed between a floor part and the at least one middle chassis, the top chassis being connected to middle chassis by a top u-shaped connecting clip, the bottom chassis being connected to middle chassis by a bottom u-shaped connecting clip, each of said u-shaped connecting clips having an open back side with a perforated front wall disposed between two perforated side walls, the front and side walls being disposed flush with the top and bottom chassis, the open back side of the connecting clips providing a space for cabling to pass into the housing, the bottom chassis being connected to the floor part which comprises a fire protection floor and a u-shaped floor clip disposed between and connected to the bottom chassis and the fire protection floor, the floor clip comprising an open back side with a perforated front wall disposed between two perforated side walls, the front and side walls being disposed flush with the bottom chassis, the open back side of the floor clip providing a space for cabling to pass into the housing, and the top chassis being connected to the cover part comprising an upper covering and a u-shaped cover clip disposed between and connected to the upper covering and the top chassis, the cover clip comprising a perforated front wall disposed between two perforated side walls, the front and side walls being disposed flush with the top chassis.

15. The housing of claim 14 wherein each chassis each further comprises two side panels that overlay the side parts and a front panel that overlays the front wall.

16. The housing of claim 15 wherein each of the chassis further comprise a u-shaped rear panel that substantially surrounds the cabling passing through the back side of the connecting clip.

17. The housing of claim 15 wherein the bottom chassis further comprises a u-shaped rear panel having an upper end that substantially surrounds the cabling passing through the back side of the connecting clip that is connected the bottom chassis to the at least one middle chassis and a lower end that substantially surrounds the cabling passing through the back side of the floor clip, and the at least one middle chassis further comprises a u-shaped rear panel having an upper end that substantially surrounds the cabling passing through the back side of the connecting clip that connected the top chassis to the at least one middle chassis.

18. The housing of claim 14 wherein each connecting clip further comprises an exhaust air plate for directing air out through the perforated front and side walls of the connecting clip.

19. The housing of claim 14 wherein each connecting clip further comprises an intake air plate for directing air inward through the perforated front and side walls of the connecting clip.

20. The housing of claim 14 wherein the floor clip further comprises at least one aeration ventilator.

21. The housing of claim 14 wherein the cover clip further comprises at least one aeration ventilator.

* * * * *